US006340266B1

(12) United States Patent
Bolotin et al.

(10) Patent No.: US 6,340,266 B1
(45) Date of Patent: Jan. 22, 2002

(54) MICRODEVICE FEEDER TO ASSEMBLY LINE HOLDING CONNECTOR SYSTEM

(75) Inventors: Lev M. Bolotin, Kirkland; Robert Bruce Hubler, Seattle; Bryan D. Powell, Maple Valley; Janine Whan-Tong, Woodinville, all of WA (US)

(73) Assignee: Data I/O Corporation, Redmond, WA (US)

( * ) Notice: Subject to any disclaimer, the term of this patent is extended or adjusted under 35 U.S.C. 154(b) by 0 days.

(21) Appl. No.: 09/484,190

(22) Filed: Jan. 18, 2000

(51) Int. Cl.⁷ .............................. B25G 3/20; F16B 1/00
(52) U.S. Cl. .......................... 403/373; 29/739; 403/13; 403/374.4; 248/229.15; 248/229.25; 248/228.6
(58) Field of Search ................................. 403/256, 257, 403/13, 373, 374.3, 374.4; 24/633, 637; 248/229.15, 229.25, 228.6; 29/739, 760

(56) References Cited

U.S. PATENT DOCUMENTS

| | | | | |
|---|---|---|---|---|
| 1,247,228 A | * | 11/1917 | Cornbrooks | ................ 403/256 |
| 1,840,216 A | * | 1/1932 | Tormo | ................... 248/229.15 |
| 2,420,895 A | * | 5/1947 | Herriman | ................ 248/229.15 |
| 2,749,068 A | * | 6/1956 | Wayman | ................ 248/229.15 |
| 3,146,982 A | * | 9/1964 | Budnick | ................ 248/229.15 |
| 4,621,406 A | * | 11/1986 | Fujiwara et al. | .......... 29/739 X |
| 5,193,268 A | | 3/1993 | Ono et al. | ..................... 29/739 |
| 5,268,059 A | * | 12/1993 | Olson | .......................... 156/584 |
| 5,322,253 A | * | 6/1994 | Stevens | |
| 5,598,986 A | | 2/1997 | Ando et al. | .............. 242/597.6 |
| 5,706,576 A | | 1/1998 | Iwasaki et al. | ................ 29/703 |
| 6,227,755 B1 | * | 5/2001 | Hata et al. | ................ 403/13 X |

\* cited by examiner

Primary Examiner—Lynne H. Browne
Assistant Examiner—Ernesto Garcia
(74) Attorney, Agent, or Firm—Mikio Ishimaru

(57) ABSTRACT

A holding connector system is provided for connecting a microdevice feeder to an assembly line table having a plurality of alignment pins. A connector body having a slot provided therein engages one of the plurality of alignment pins and a table recess in the connector body holds it to the assembly line table. A threaded knob secures the connector body to the assembly line table. The microdevice feeder is provided with an alignment plate, which has fingers engaging the alignment pins to cause the microdevice feeder to be properly aligned with the assembly line table. A clamping plate on the microdevice feeder engages a portion of the connector body, which holds down the microdevice feeder.

18 Claims, 4 Drawing Sheets

MICRODEVICE FEEDER TO ASSEMBLY LINE HOLDING CONNECTOR SYSTEM

CROSS-REFERENCE TO RELATED APPLICATION

The present application contains subject matter related to a co-pending U.S. Patent Application by Lev M. Bolotin entitled "MANUFACTURING SYSTEM WITH FEEDER/PROGRAMMING/BUFFER SYSTEM". The related application is assigned to Data I/O Corporation, is identified by U.S. Ser. No. 09/418,732, and is hereby incorporated by reference.

TECHNICAL FIELD

The present invention relates generally to a connector system for connecting two systems and more particularly to a connector system for connecting an electronic microdevice feeder to an electronic assembly line.

BACKGROUND ART

In the past, electronic devices were supplied by a microdevice feeder to a robotic feeding system which removed the electronic microdevices and placed them on printed circuit boards moving through an electronic assembly line. The microdevice feeders were generally aligned on a table underneath the robotic handling system and held in place in part by the microdevice feeder's weight. Sometimes, the microdevice feeder had additional legs which helped support its full weight.

The microdevice feeders were generally not held down so as to permit easy removal and replacement of the microdevice feeders. Also to allow easy removal and replacement, the electrical cables and/or pneumatic tubes were connectable to the microdevice feeder on the portion away from where the microdevice feeder's weight was primarily supported and also away from the robotic handling system. This meant that the weight support acted as a fulcrum between the connections and the robotic handling system.

The above arrangement was prone to accidents. For example, when an operator was in a hurry to remove the microdevice feeder from the table, the operator would pull the cable and/or tubing downward to pull the connections loose. This would cause a tipping of the microdevice feeder with the connection end going down and the portion under the robotic handling system going up to crash into the pick-and-place head of the robotic handling system. A pick-and-place head generally costs between forty to fifty times the cost of a microdevice feeder, and this accident would typically destroy the pick-and-place head completely. Further, this would often disable the entire electronic assembly line with a resulting costly loss of production.

A number of different approaches have been taken to try to solve this problem. For example, the table/microdevice feeder system would often be redesigned to provide a clamping/latching mechanism. This complicated the installation process because it interfered with free removal and replacement of the microdevice feeder because of the space limitations in the microdevice feeder and table area.

Another approach has been to add additional legs with adjustable feet that would provide additional support for the weight of the microdevice feeder closer to the cable and/or tube connections. Unfortunately, even with this approach it is possible for an operator in a hurry to still tip the microdevice feeder on the table.

A further approach has been to put a cover plate over all the microdevice feeders to act as a holddown to prevent the microdevice feeders from tipping. The drawback is that a single microdevice feeder cannot be removed independently and the robotic handling system and the production assembly line have to be stopped in order to remove a single microdevice feeder.

Thus, those skilled in the art have long sought a connection system, which would allow fast replacement of the microdevice feeders on an individual basis without the possibility of damaging the robotic handling system. Previous systems by those skilled in the art have been unsuccessful in providing a fully adequate solution.

DISCLOSURE OF THE INVENTION

The present invention provides a holding connector system for connecting a first structure to a second structure having a plurality of alignment pins. A connector body having an opening provided therein engages one of the plurality of alignment pins and a recess in the connector body holds it to the second structure. A securing mechanism secures the connector body to the second. The first structure is provided with an alignment mechanism to cause the first structure to be properly aligned with the second structure. A portion of the connector body engages and holds down the first structure. Thus, the holding connector system allows for simple, easy installation and removal of the first structure.

The present invention further provides a holding connector system for connecting a microdevice feeder to an assembly line table having a plurality of alignment pins. A connector body having a slot provided therein engages one of the plurality of alignment pins and a table recess in the connector body holds it to the assembly line table. A threaded knob secures the connector body to the assembly line table. The microdevice feeder is provided with an alignment plate, which has fingers engaging the alignment pins to cause the microdevice feeder to be properly aligned with the assembly line table. A clamping plate on the microdevice feeder engages a portion of the connector body, which holds down the microdevice feeder. Thus, the connector system allows for simple, easy installation and removal of the microdevice feeder without the possibility of tipping.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
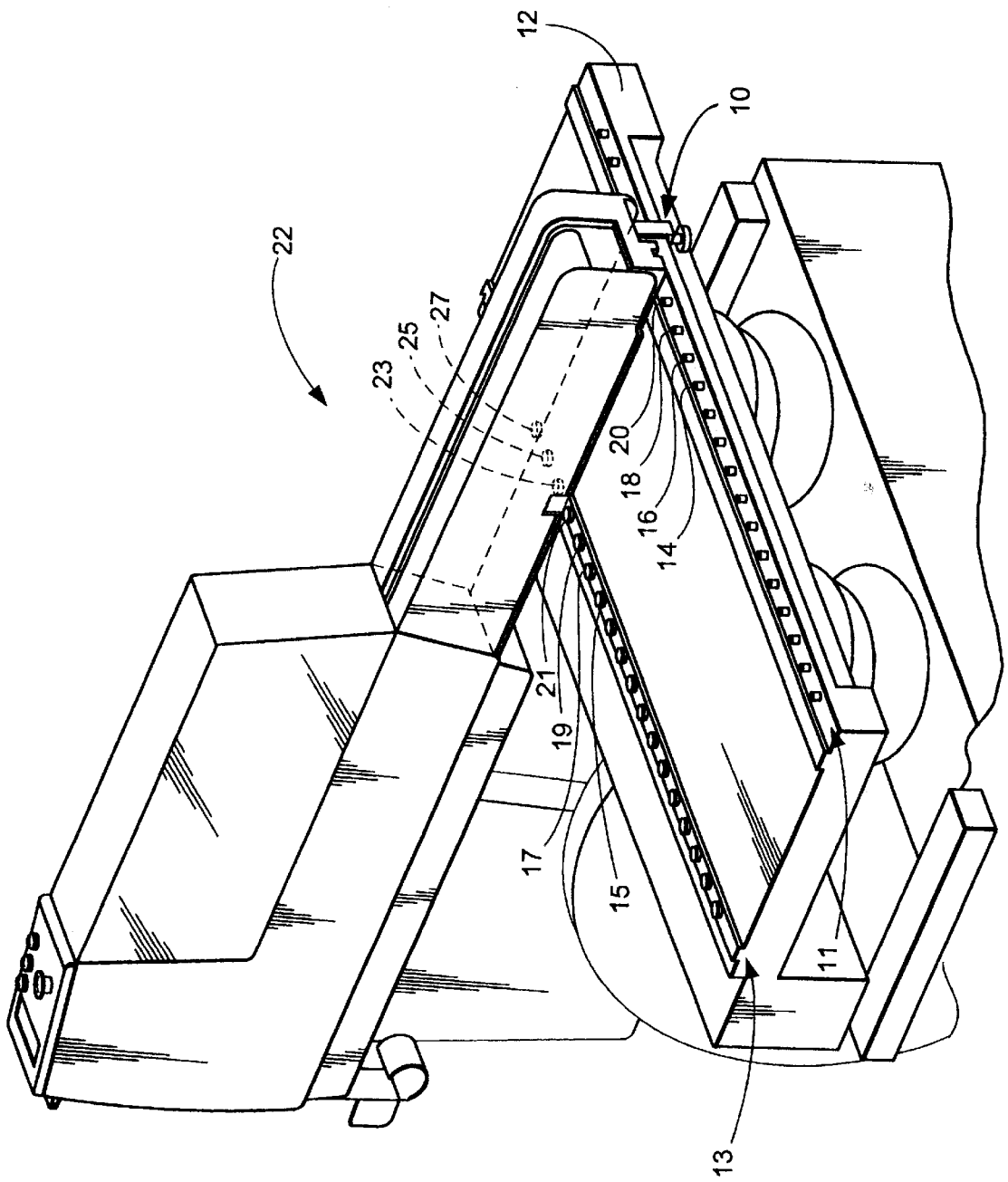
FIG. 1 is an isometric view of the present invention in its operating environment.

Structure:

Referring now to FIG. 1, therein is shown an isometric view of a microdevice feeder to assembly line holding connector system 10 of the present invention in its operative environment. A conventional assembly line table 12 of an electronic assembly line (not shown) has a plurality of spaced apart front alignment pins 11 of which tapered-top, cylindrical, front alignment pins 14, 16, 18, and 20 are typical. The front alignment pins 11 are in line and extend across the assembly line table 12. The assembly line table 12 also has a plurality of back alignment pins 13 of which hemispherical-head, cylindrical, back alignment pins 15, 17, 19, and 21 are typical. The back alignment pins 13 are in line both with themselves and with the front alignment pins 11 and also extend parallel to the front alignment pins 11. The front and back alignment pins 11 and 13 are spaced apart varying distances based on the particular assembly line table 12 but the distances are always regular increments.

A microdevice feeder 22 is shown positioned over the assembly line table 12 with its main length perpendicular to the front alignment pins 11 and the back alignment pins 13. The microdevice feeder 22 is held in alignment by one of the front alignment pins 11 and one of the back alignment pins 13. The alignment by the one of the front alignment pins 11 will be described later, but the one of the back alignment pins 13, designated as back alignment pins 21, 23, 25, or 27, fits into a precision hole (not shown) in the underside of the microdevice feeder 22. It should be understood that there are a number of other holes in the underside also to provide clearance holes for the back alignment pins under the microdevice feeder 22 which are not being used for alignment.

Figure 2:
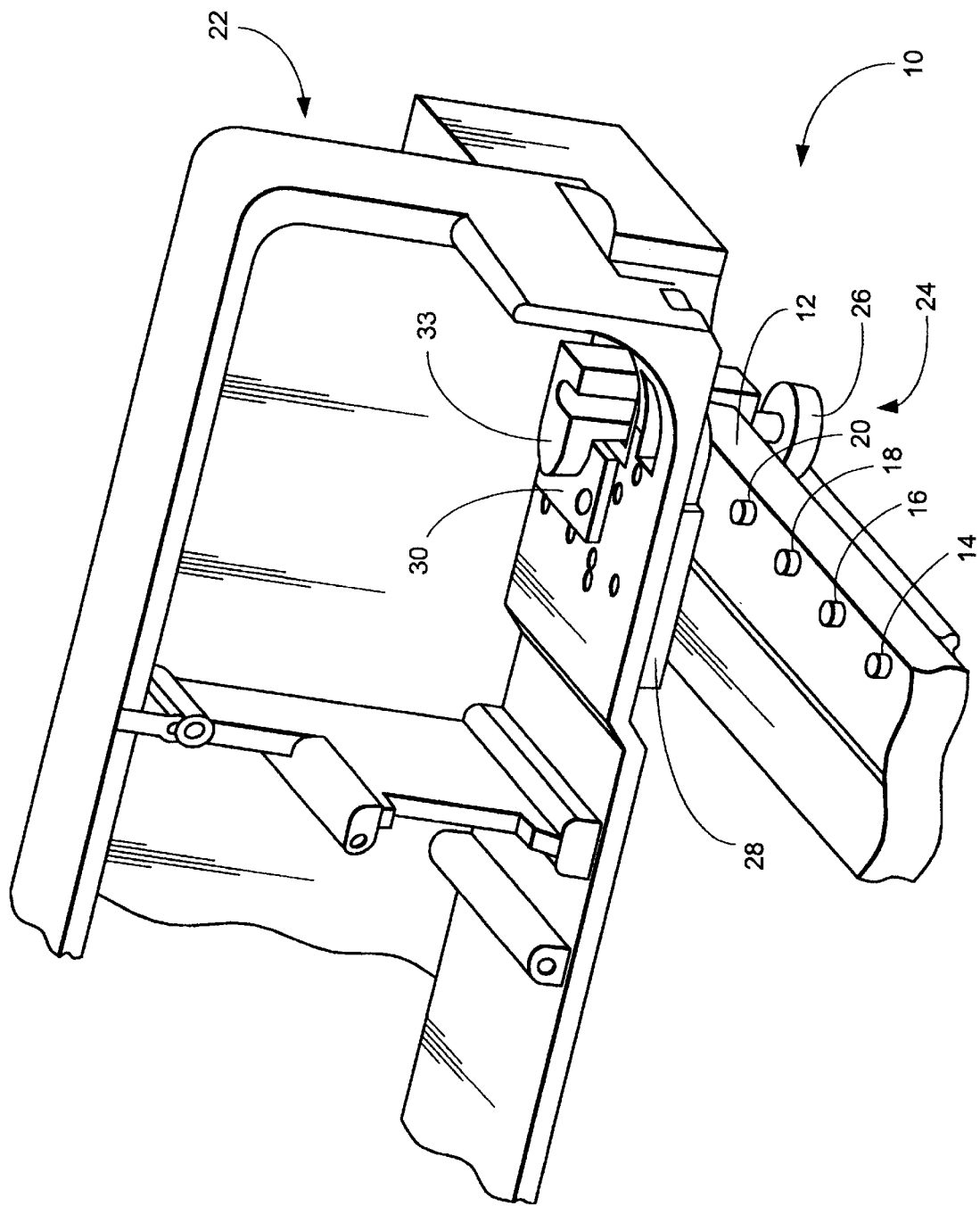
FIG. 2 is an isometric cutaway view showing the present invention in its operating environment.

Referring now to FIG. 2, therein is shown an isometric cutaway view showing the microdevice feeder to assembly line holding connector system 10 of the present invention in its operative environment.

The microdevice feeder 22 is held in place by a holding mechanism 24, which is aligned by one of the front alignment pins 11 and is locked in place by a threaded knob 26. The microdevice feeder 22 has a centering plate 28 and a clamping plate 30 which the holding mechanism 24 uses to hold the microdevice feeder 22 to the assembly line table 12.

It would be understood by those skilled in the art that generally a microdevice feeder housing 31 is made of a soft, light material such as aluminum and, thus, the centering plate 28 and the clamping plate 30 are of a harder, rigid, wear resistant material, such as steel, to avoid wearing down the aluminum through frequent changes of position. Similarly, a connector body 33 of the holding mechanism 24 is also of a material such as steel.

Figure 3:
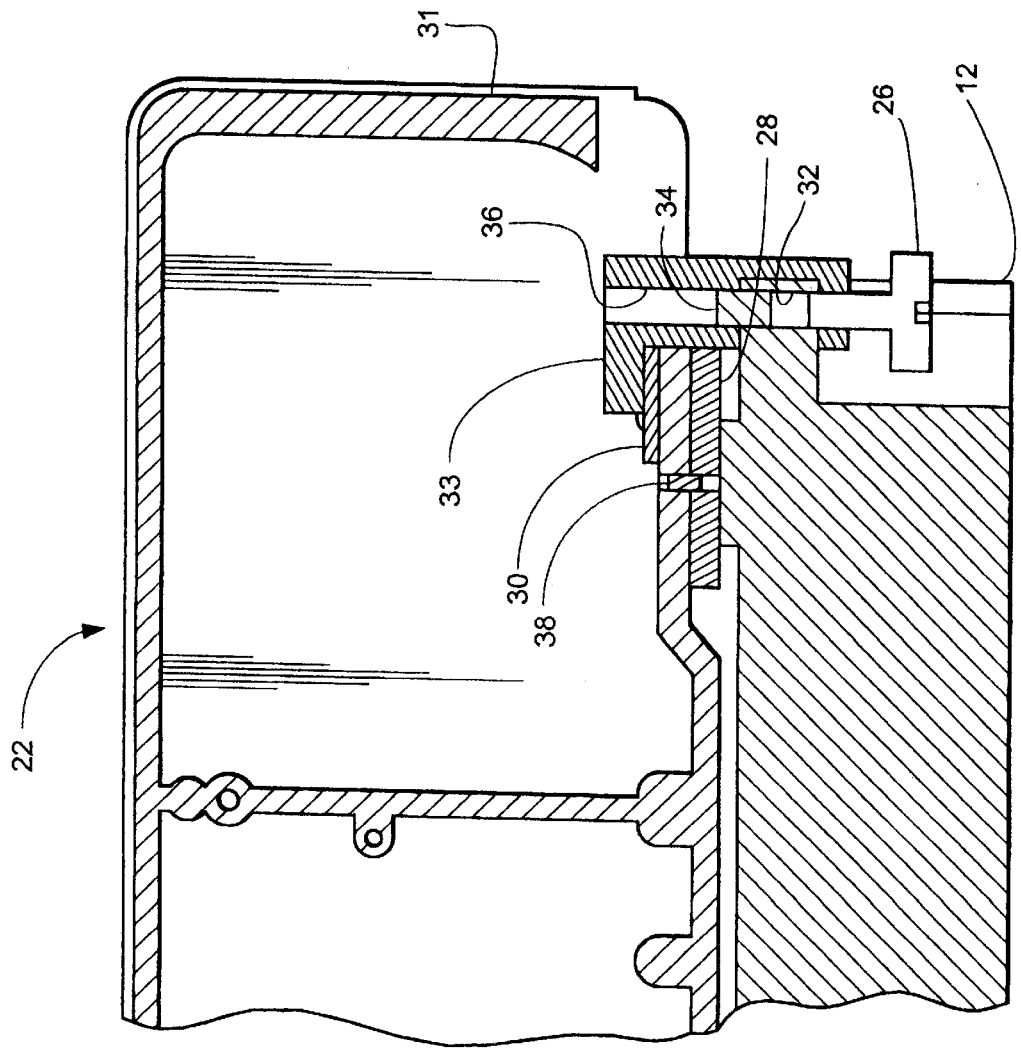
FIG. 3 is a cross-sectional view of the structure of FIG. 2.

Referring now to FIG. 3, therein is shown a cross-sectional view of FIG. 2 through the microdevice feeder 22. The assembly line table 12 has a through-hole 32 provided therein into which a front alignment pin 34 is partially inserted. The front alignment pin 34 is identical to and is inserted in the same manner as the front alignment pins 11 in the assembly line table 12.

The holding mechanism 24 has the threaded knob 26 engaging the hole 32 with a slot 36 provided therein for engaging the front alignment pin 34.

The centering plate 28 has a pair of alignment pins (alignment pin 38 only is shown) partially inserted so as to extend into the microdevice feeder 22 to provide precision location for the centering plate 28.

Figure 4:
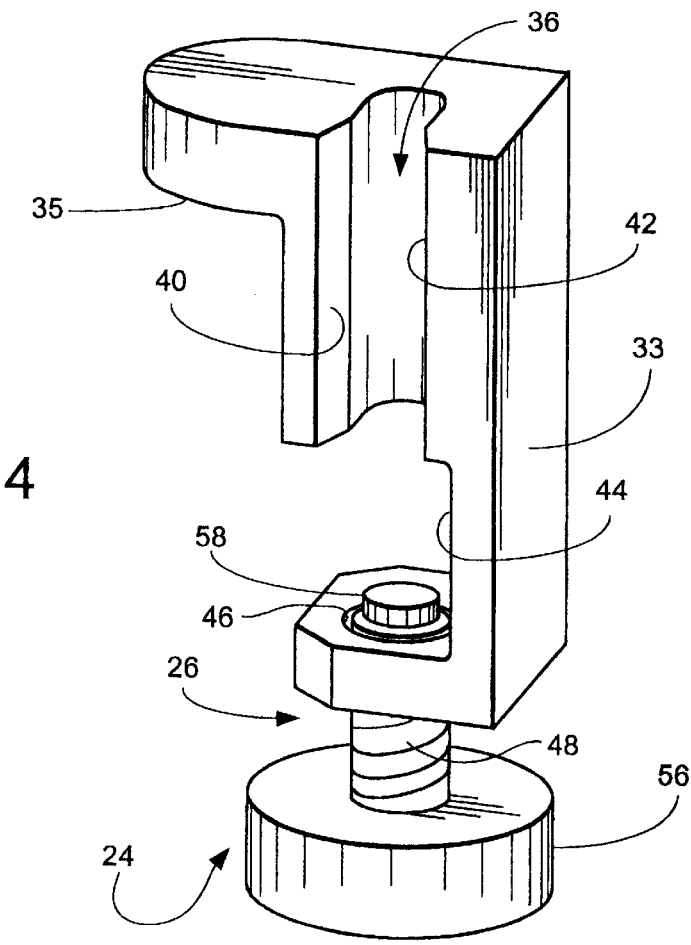
FIG. 4 is an isometric view of the holding mechanism of the present invention.

Referring now to FIG. 4, therein is shown an isometric view of the holding mechanism 24. The holding mechanism 24 includes a connector body 33, which has an engagement portion 35 which extends out from the connector body 33. The slot 36 has bevels 40 and 42, which are provided in the connector body 33. The connector body 33 has a table recess 44 provided therein so that the slot 36 is in one portion of the connector body 33 and a threaded hole 46 is provided in the other. The threaded knob 26 has a threaded portion 48, which is threaded into the threaded hole 46 using a knob 56 so as to cause a centering portion 58 (which can be cylindrical as shown, conical, or hemispherical) of the threaded knob 26 to extend out of the threaded hole 46 and secure the connector body 33 to the assembly line table 12.

As would be evident to those skilled in the art, the securing mechanism of the threaded knob 26 may be replaced by a number of different expedients, one of which would be a spring-loaded centering pin.

Figure 5:
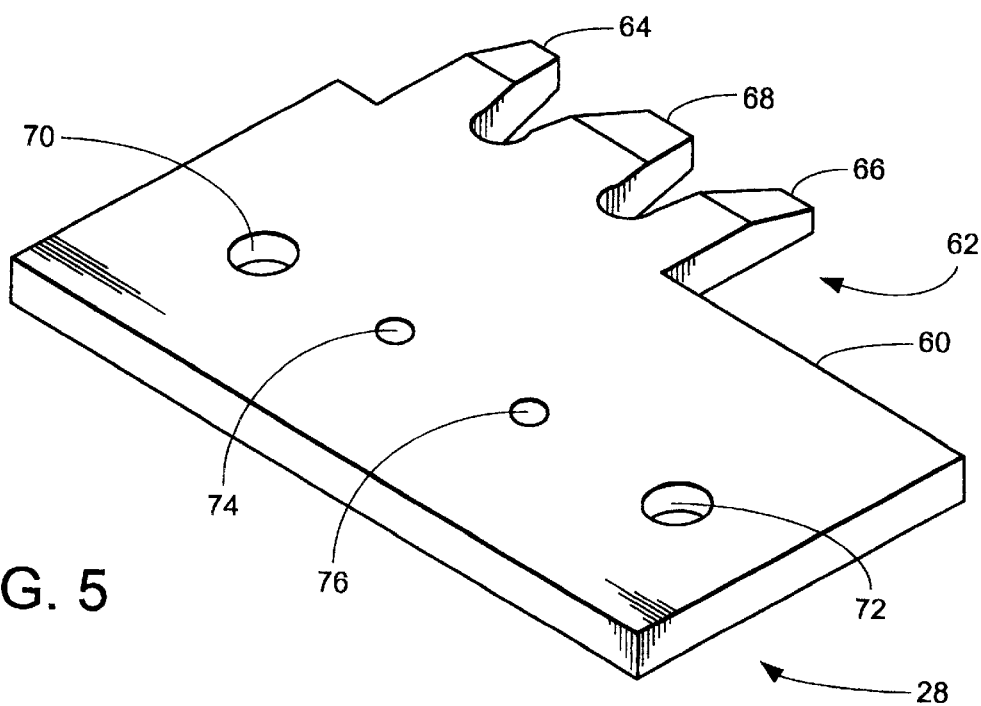
FIG. 5 is an isometric view of a centering plate of the present invention.

Referring now to FIG. 5, therein is shown the centering plate 28 upside down. The centering plate 28 has a body portion 60 with a plurality of fingers 62 extending therefrom. The fingers 62 are designated as single beveled fingers 64 and 66 and a double beveled finger 68. The body portion 60 has a pair of countersunk holes 70 and 72 for fastening screws (not shown) and alignment pin holes 74 and 76 for insertion of a pair of alignment pins (not shown but one of which is alignment pin 38 of FIG. 2).

Operation:

An operator determines the location for the microdevice feeder 22 and selects an alignment pin to one side of the centerline of where the microdevice feeder 22 will go. For example, if the centerline would be on the front alignment pin 18, the holding mechanism 24 would be placed next to the front alignment pin 20 with the table recess 44 over the assembly line table 12. The holding mechanism 24 will be moved parallel to the line of the front alignment pins 11 until the bevel 40 or 42 contacts the front alignment pin 20 and further movement of the holding mechanism 24 moves the connector body 33 until the slot 36 lines up with the front alignment pin 20. When the front alignment pin 20 is in the slot 36, the threaded knob 26 will be tightened until the cylindrical portion 58 secures the holding mechanism 24 in the hole 32 of the assembly line table 12.

Once the holding mechanism 24 is in place, the operator lifts the microdevice feeder 22 into place. The operator moves the microdevice feeder towards the front alignment pins 11 with the end towards the back alignment pins 13 slightly lifted. The microdevice feeder 22 carries the centering plate 28 and the clamping plate 30. The microdevice feeder 22 has the centering plate 28 arranged with the fingers 62 facing the front alignment pin 18. As the centering plate 28 is moved towards the front alignment pins 11, the single beveled finger 64 or 66 engages the front alignment pin 18 to shift the microdevice feeder 22 parallel to the front alignment pins 11 until the single beveled finger 64 or 66 and the double beveled finger 68 engage the front alignment pin 18. The clamping plate 30 engages the engagement portion 35 of the holding mechanism 24 and the portion of the microdevice feeder 22 with the precision hole is lowered over one of the back alignment pins 13 which aligns the microdevice feeder 22 perpendicular to the front alignment pins 11 and the back alignment pins 13 using only two alignment pins.

As previously mentioned, the back alignment pins 13 have hemispherical heads which permit the microdevice feeder 22 to be lowered in a slight arc with a small bit of lateral movement to ease the perpendicular alignment. The engagement portion 35 prevents tipping. With the centering plate 28 being of steel and the assembly line t able 12 magnetized, a magnetic holding effect prevents rocking of the microdevice feeder 22 from side to side.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A holding connector system comprising:

a first structure;

a second structure having a plurality of alignment pins, a connector body having an opening provided therein for engaging one of the plurality of alignment pins, said connector body having a portion provided therein for engaging said connector body with said second structure, and said connector body having engagement means for holding said first structure between said connector body and said second structure;

said first structure having means for aligning said first structure with said second structure using another of the plurality of alignment pins, said first structure having means for engaging a further one of the plurality of alignment pins distal from said another of the plurality of alignment pins; and means for securing said connector body to said second structure.

2. The holding connector system as claimed in claim 1 wherein:

said plurality of alignment pins comprising a first and second plurality of alignment pins, said first and second plurality of alignment pins are parallel and in line; and said means for alignment using said another of said plurality of alignment pins engaging a pin in said first plurality of alignment pins, and said means for engaging said further one of the plurality of alignment pins engages a pin in said second plurality of alignment pins;

whereby a length of the first structure is aligned perpendicular to the parallel first and second plurality of alignment pins.

3. The holding connector system as claimed in claim 1 wherein:

said connector body having a securing portion with a hole provided therein; and said means for securing said connector body is a member for engaging said hole and said second structure.

4. The holding connector system as claimed in claim 3, wherein:

said connector body having said hole with threads provided therein; and said means for securing a threaded member engageable with said second structure proximate one of said plurality of alignment pins to hold said connector body in fixed relationship therewith.

5. The holding connector system as claimed in claim 1 wherein said connector body has a bevel provided therein adjacent said opening for guiding said connector body over said one of said plurality of alignment pins.

6. The holding connector system as claimed in claim 1 wherein said connector body is of a rigid, wear-resistant, material.

7. The holding connector system as claimed in claim 1 wherein said means for aligning has a plurality of fingers thereon for engaging said another of said plurality of alignment pins.

8. The holding connector system as claimed in claim 1 wherein said first structure includes a clamping plate for engaging said engagement portion of said connector body, said clamping plate of a rigid, wear-resistant, material.

9. A holding connector system comprising:

a microdevice feeder;

an assembly line table having a plurality of front and back alignment pins;

a connector body having a slot provided therein for engaging one of the plurality of front alignment pins, said connector body having an engagement portion for holding said microdevice feeder to said assembly line table, and said connector body having a table recess provided therein for engaging said connector body with said assembly line table, and said connector body having an engagement portion for holding said microdevice feeder between said connector body and said assembly line table;

said microdevice feeder having a centering plate for aligning said microdevice feeder with said assembly line table using another of the plurality of front alignment pins, said microdevice feeder has a precision hole provided therein for engaging one of the plurality of back alignment pins distal from said plurality of front alignment pins; and a means for securing said connector body to said assembly line table.

10. The holding connector system as claimed in claim 9 wherein:

said assembly line table has said plurality of front and back alignment pins parallel and in line; and said microdevice feeder has a precision hole for engaging one of said plurality of back alignment pins in line with one of said plurality of front alignment pins which are in line whereby a length of the microdevice feeder is aligned perpendicular to the parallel plurality of front and back alignment pins.

11. The holding connector system as claimed in claim 9 wherein:

said connector body having a securing portion with a hole provided therein; and said means securing said connector body is a member for movable in and engaging said hole, said assembly line table having a hole provided therein in line with said one of said front alignment pins, said member is for engaging said hole in said table.

12. The holding connector system as claimed in claim 9 wherein:

said connector body having a threaded hole provided therein adjacent said slot; and said means for securing includes a threaded knob having a threaded member for engaging said threaded hole and securing said connector body adjacent to said one of said plurality of front alignment pins.

13. The holding connector system as claimed in claim 9 wherein:

said assembly line table has provided therein a precision hole in which said one of said plurality of front alignment pins is disposed;

said connector body having a threaded hole provided therein adjacent said slot; and said means for securing includes a threaded knob having a threaded member for engaging said threaded hole, said threaded member having a portion securing said connector body to said assembly line table by precisely engaging said precision hole.

14. The holding connector system as claimed in claim 9 wherein said connector body has a pair of bevels provided therein adjacent to said slot for guiding said connector body into engagement with said one of said plurality of front alignment pins.

15. The holding connector system as claimed in claim 9 wherein said connector body is made of steel.

16. The holding connector system as claimed in claim 9 including:

a centering device connected to said microdevice feeder for centering said microdevice feeder with respect to said plurality of front and back alignment pins.

17. The holding connector system as claimed in claim 16 wherein the centering device has a plurality of beveled fingers thereon for engaging at least one of said plurality of front alignment pins.

18. The holding connector system as claimed in claim 17 wherein said microdevice feeder includes a clamping plate and said clamping plate is of steel.

* * * * *